United States Patent
Rogojina et al.

(10) Patent No.: US 11,945,961 B2
(45) Date of Patent: *Apr. 2, 2024

(54) STABILIZED PRINT MATERIALS

(71) Applicant: Kateeva, Inc., Newark, CA (US)

(72) Inventors: Elena Rogojina, San Jose, CA (US);
Inna Gurevitch, Hayward, CA (US);
Teresa A. Ramos, San Jose, CA (US);
Siddharth Harikrishna-Mohan,
Chicago, IL (US); Robert Richard Roth, Sunnyvale, CA (US); Noa Cohen, Pleasanton, CA (US); Elena Sheina, Fremont, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/809,082

(22) Filed: Jun. 27, 2022

(65) Prior Publication Data

US 2022/0332966 A1 Oct. 20, 2022

Related U.S. Application Data (63) Continuation of application No. 16/703,631, filed on Dec. 4, 2019, now Pat. No. 11,407,914.
(Continued)

(51) Int. Cl.
*C09D 11/50* (2014.01)
*B41M 5/00* (2006.01)
(Continued)

(52) U.S. Cl.
CPC .......... *C09D 11/50* (2013.01); *B41M 5/0023* (2013.01); *C09D 11/037* (2013.01);
(Continued)

(58) Field of Classification Search
CPC ... B41J 2/01; B41J 2/211; B41J 2/1433; B41J 2/17; B41J 2/17593; B41J 2/2107;
(Continued)

(56) References Cited

U.S. PATENT DOCUMENTS 11,407,914 B2 * 8/2022 Rogojina ............... C09K 11/02
2008/0277626 A1 * 11/2008 Yang ...................... C09D 11/50
252/301.36
(Continued)

FOREIGN PATENT DOCUMENTS

CN 101120066 A 2/2008
CN 102683369 A 9/2012
(Continued)

OTHER PUBLICATIONS

CN Office Action dated May 23, 2022 for CN Patent Application No. 201980080829.8.
(Continued)

*Primary Examiner* — Manish S Shah
(74) *Attorney, Agent, or Firm* — Hauptman Ham, LLP (57) ABSTRACT

A print material includes a vinylic molecule, a vinylic cross-linker molecule having a plurality of vinyl groups, a quantum dot, a light-scattering particle having a surface composition, and a dispersant having a chemical affinity matched to the surface composition. Methods of making and using such print materials are also described.

20 Claims, 3 Drawing Sheets

Related U.S. Application Data (60) Provisional application No. 62/775,957, filed on Dec. 6, 2018.

(51) Int. Cl.
*C09D 11/037* (2014.01)
*C09D 11/107* (2014.01)
*C09D 11/322* (2014.01)
*C09K 11/02* (2006.01)
*H01L 33/50* (2010.01)
*H01L 33/56* (2010.01)

(52) U.S. Cl.
CPC .......... *C09D 11/107* (2013.01); *C09D 11/322* (2013.01); *C09K 11/02* (2013.01); *H01L 33/502* (2013.01); *H01L 33/507* (2013.01); *H01L 33/56* (2013.01); *H01L 2933/0041* (2013.01); *H01L 2933/005* (2013.01); *H01L 2933/0091* (2013.01)

(58) Field of Classification Search
CPC ...... B41J 2/1755; B41J 2/2114; B41J 2/2117; B41J 2/2056; B41J 2/21; B41J 2/0057; B41J 3/60; B41J 2002/012; B41J 2/04598; B41J 2/04588; B41J 2/04595; B41J 2/04586; B41J 2/14274; B41J 2/1623; B41J 2202/00; B41J 2202/03; B41J 2/14201; B41J 2/045; B41J 11/0015; B41J 11/002; B41J 2/04581; B41J 2/055; B41J 2/16538; B41J 2002/16502; B41J 29/02; B41J 2/17513; B41J 2/17509; B41J 29/13; B41J 2/17553; B41J 2/1606; B41J 2/1642; B41J 2/1609; B41J 2/164; B41J 2/162; B41J 2/161; B41J 2/19; B41J 15/04; C09D 11/36; C09D 11/40; C09D 11/30; C09D 11/38; C09D 11/32; C09D 11/322; C09D 11/324; C09D 11/328; C09D 11/101; C09D 11/102; C09D 11/005; C09D 11/54; C09D 11/52; C09D 11/106; B41M 5/0011; B41M 5/0017; B41M 5/0023; B41M 5/0047; B41M 7/00; B41M 7/0072; B41M 5/52; B41M 5/5218; B41M 5/5227

See application file for complete search history.

(56) References Cited

U.S. PATENT DOCUMENTS

| | | |
|---|---|---|
| 2014/0374375 A1 | 12/2014 | Zwiers et al. |
| 2015/0075397 A1 | 3/2015 | Gresty et al. |
| 2015/0197648 A1 | 7/2015 | Watanabe et al. |
| 2017/0015793 A1 | 1/2017 | Watanabe et al. |
| 2017/0248809 A1* | 8/2017 | Oba ...................... G02B 6/005 |
| 2017/0321114 A1* | 11/2017 | Kamo .................. C09D 201/00 |
| 2018/0014410 A1 | 1/2018 | Darrow et al. |
| 2018/0102449 A1* | 4/2018 | Pschenitzka .... H01L 31/035218 |
| 2019/0391418 A1* | 12/2019 | Yamaguchi ....... G02F 1/136277 |

FOREIGN PATENT DOCUMENTS

| | | |
|---|---|---|
| CN | 103772872 A | 5/2014 |
| CN | 105694590 A | 6/2016 |
| KR | 1020080033355 A | 4/2008 |
| WO | 2018105545 A1 | 6/2018 |

OTHER PUBLICATIONS

International Search Report dated Feb. 12, 2020 to PCT Application PCT/US19/64617.
KR Second Office Action dated Mar. 11, 2022 for KR Application No. 10-2021-7021037.
Non-final Office Action dated Nov. 24, 2021 for U.S. Appl. No. 16/703,631.
Notice of Allowance dated Apr. 13, 2022 for U.S. Appl. No. 16/703,631.
Second Office Action dated Dec. 8, 2020 to CN Patent Application No. 201680050331.3.

\* cited by examiner

STABILIZED PRINT MATERIALS

CROSS-REFERENCE TO RELATED APPLICATIONS

This application is a continuation of U.S. patent application Ser. No. 16/703,631, filed on Dec. 4, 2019, which claims benefit of U.S. Provisional Patent Application Ser. No. 62/775,957 filed Dec. 6, 2018, which are incorporated herein by reference.

FIELD

Embodiments of the present invention generally relate to inkjet printers. Specifically, methods and compositions for stable print materials are described.

BACKGROUND

Inkjet printing is common, both in office and home printers and in industrial scale printers used for fabricating displays, printing large scale written materials, adding material to manufactured articles such as PCB's, and constructing biological articles such as tissues. Most commercial and industrial inkjet printers, and some consumer printers, use piezoelectric dispensers to apply print material to a substrate.

The print materials typically include a matrix material along with solids dispersed in the matrix material. Maintaining dispersion of the solids in the matrix material is an ongoing challenge for which solutions are needed.

SUMMARY

Embodiments described herein provide a print material, comprising a vinylic molecule; a vinylic cross-linker molecule having a plurality of vinyl groups; a quantum dot; a light-scattering particle having a surface composition; and a dispersant having a chemical affinity that is matched to the surface composition.

Other embodiments described herein provide a method of making a material layer, comprising applying a mixture to a substrate, the mixture comprising a vinylic molecule; a vinylic cross-linker molecule having a plurality of vinyl groups; a quantum dot; a light-scattering particle having a surface composition; and a dispersant having a chemical affinity that is matched to the surface composition; and polymerizing the mixture to form a material layer on the substrate.

Other embodiments described herein provide a method of making a print material, comprising blending a quantum dot material with a curable material to form a quantum dot mixture; blending a dispersant with the quantum dot mixture to form a quantum dot precursor; and blending a light-scattering particle material with the quantum dot precursor to make a print material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Quantum dot materials are now commonly used to make light-emitting devices such as display panels. These display panels can range from smart-phone displays up to large television screens. Quantum dots are particles with specific optical properties beneficial to such displays. In most cases, a quantum dot absorbs photons of one wavelength and emits photons of a different wavelength. For example, a quantum dot may absorb photons at a wavelength in the blue portion of the visible spectrum and emit photons at a wavelength in the green or red portion of the visible spectrum. Displays can be made using such materials to emit green or red light to provide a green or red pixel and blue light can be transmitted unaltered to provide a blue pixel.

Figure 1:
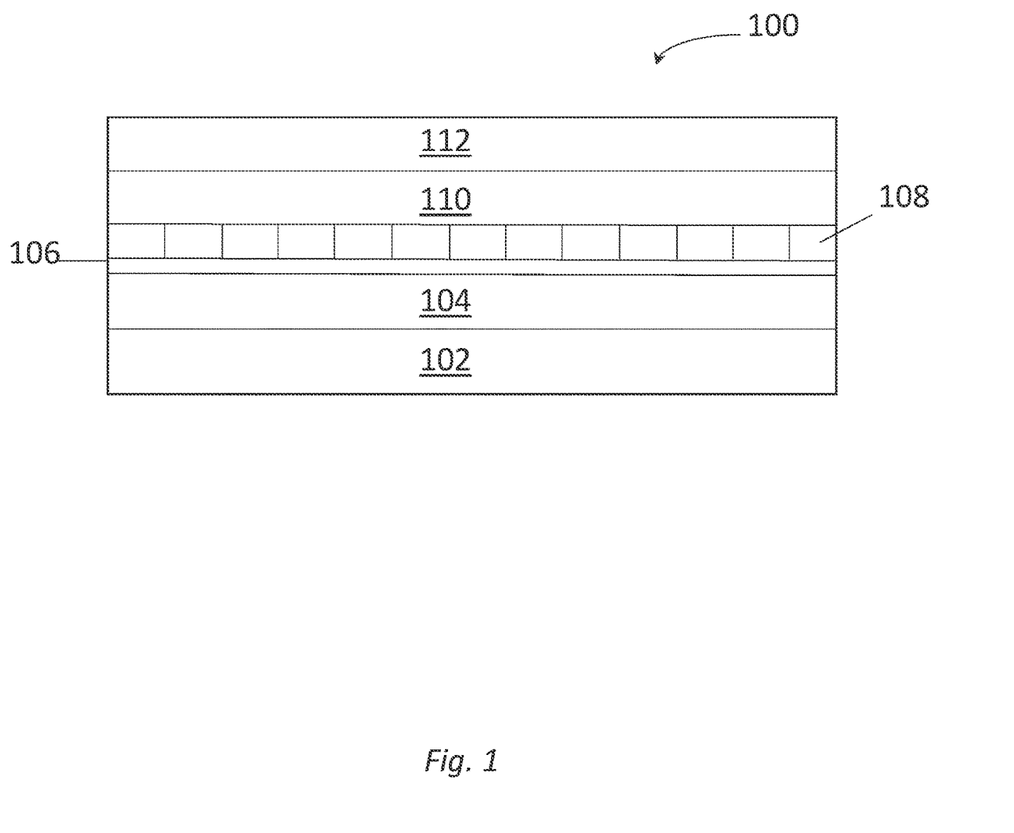
FIG. 1 is a schematic side view of a device according to one embodiment.

FIG. 1 is a schematic side view of a device 100 according to one embodiment. The device of FIG. 1 is a patterned light-emitting device that emits patterns of red, green, and blue light according to a regular distribution of red-emitting regions, green-emitting regions, and blue-emitting regions called pixels. A substrate 102 provides structural support for the device, and may be glass, plastic, silicon, or any other material suitable for supporting the device. A light-emitting component 104 is formed on the substrate 102, in this case as a layer. The light-emitting component 104 may include LED's or other solid state light-emitting elements. A buffer 106 may be formed over and around the light-emitting component 104 to encapsulate the light-emitting component 104.

Pixels 108 are schematically represented on the buffer 106. The pixels 108 are typically formed by applying a separating material and then patterning the separating material to define pixel wells. Color materials are disposed in the pixel wells to provide desired colors for the pixels. The color material is typically a polymer with dispersed solids to provide the desired color. One of the solid materials included in the color material is a light-scattering particle. Another solid material used in the color material is a green or red quantum dot. The quantum dot is a crystalline particle made of a semiconductor material, such as a group IV, III-V, or II-VI material. Materials from which quantum dots are made include Si, Ge, SiGe, InP, ZnS, ZnSe, CdSe, and CdS. The light-scattering particle is a ceramic material, such as titania, zirconia, or silica, which may have a coating of silica, alumina, or zirconia, or a combination thereof. A dispersion of the light-scattering particles typically features particles of dimension in a range from 30 nm to 400 nm.

A planarizing material 110 is sometimes formed over the pixels 108, and other functional materials, represented here as 112, can also be used as part of the device.

The color material disposed in the pixel wells is formed by depositing a precursor material in the pixel wells as a liquid and then drying and/or curing to harden the precursor material into a solid. The precursor material includes the solids described above dispersed in a polymerizable blend of monomers, oligomers, and/or polymers. The polymerizable blend is typically a relatively low viscosity material, so settling and separation of the solids from the dispersion can result in maldistribution of quantum dots and light-scattering particles in the pixels. To stabilize the dispersion, a dispersant is added to the precursor. A residue of the dispersant remains in the polymer after hardening.

The polymer is a vinylic polymer made from vinylic monomers that are polymerized using thermal heat or ultraviolet radiation. The vinylic monomers have one or more carbon-carbon double bonds, so the vinylic monomers can be monofunctional or polyfunctional. The vinylic monomers can be linear, branched, cyclic, conjugated, aromatic, or aliphatic, and may contain heteroatoms in some cases. Examples of types of molecules that may serve as monomers include mono- or polyfunctional styrenic compounds and mono- or polyfunctional acrylates, which includes all molecules having acrylate groups. (Meth)acrylate compounds, including mono(meth)acrylates, di(meth)acrylates, tri(meth) acrylates, and tetra(meth)acrylates are usable. Comonomer systems can also be used to make a suitable polymer matrix. Comonomer systems such as acid/alcohol (polyester), amine/alcohol (polyurethane), amine/anhydride (polyimide), and dichlorosilane/water (silicone) can be used to make an optically clear polymer matrix to support a dispersion of quantum dots and/or light-scattering particles.

Examples of usable (meth)acrylate monomers include alkyl or aryl (meth)acrylates, such as methyl (meth)acrylate, ethyl (meth)acrylate, and benzyl (meth)acrylate (BMA); cyclic trimethylolpropane formal (meth)acrylate; alkoxylated tetrahydrofurfuryl (meth)acrylate; phenoxyalkyl (meth)acrylates, such as 2-phenoxyethyl (meth)acrylate and phenoxymethyl (meth)acrylate; 2(2-ethoxyethoxy)ethyl (meth)acrylate. Other suitable di(meth)acrylate monomers include 1,6-hexanediol diacrylate, 1,12 dodecanediol di(meth)acrylate; 1,3-butylene glycol di(meth)acrylate; di(ethylene glycol) methyl ether methacrylate; polyethylene glycol di(meth)acrylate monomers, including ethylene glycol di(meth)acrylate monomers and polyethylene glycol di(meth)acrylate monomers having a number average molecular weight in the range from, for example, about 200 g/mol to about 500 g/mol. Other mono- and di(meth)acrylate monomers that can be included in various embodiments of the ink compositions, alone or in combination, include dicyclopentenyloxyethyl acrylate (DCPOEA), isobornyl acrylate (ISOBA), dicyclopentenyloxyethyl methacrylate (DC-POEMA), isobornyl methacrylate (ISOBMA), and N-octadecyl methacrylate (OctaM). Homologs of ISOBA and ISOBMA (collectively "ISOB(M)A" homologs) in which one or more of the methyl groups on the ring is replaced by hydrogen can also be used.

Generally, useable di(meth)acrylate monomers are alkoxylated aliphatic di(meth)acrylate monomers. For example, neopentyl glycol di(meth)acrylates, including alkoxylated neopentyl glycol diacrylates, such as neopentyl glycol propoxylate di(meth)acrylate and neopentyl glycol ethoxylate di(meth)acrylate, can be used. The neopentyl glycol di(meth)acrylate monomers have molecular weight from about 200 g/mol to about 400 g/mol, such as from about 280 g/mol to about 350 g/mole, for example about 300 g/mol to about 330 g/mol. Neopentyl glycol propoxylate diacrylate can be obtained as SR9003B from Sartomer Corporation or as Aldrich-412147 from Sigma Aldrich Corporation. Neopentyl glycol diacrylate is available as Aldrich-408255 from Sigma Aldrich Corporation.

Styrenic monomers that may be used include styrene and alkylated styrenes such as methyl- and ethyl-substituted styrenes with any number of substituents, divinylbenzene and alkylates thereof, styrene or divinylbenzene dimerized or oligomerized with other olefins and diolefins such as butadiene, acrylonitrile, and acrylates. Styrene can be dimerized or oligomerized with dienes such as butadiene, pentadiene, divinylbenzene, cyclopentadiene, norbornadiene, and the like, while divinylbenzene can be dimerized or oligomerized with olefins such as ethylene, propylene, styrene, acrylic compounds such as acrylonitrile, acrylic acids, acrylates, and other familiar olefins, and/or with dienes such as butadiene, pentadiene (isoprene, piperylene), hexadiene, cyclopentadiene, and norbornadiene.

Some monomers may be crosslinking agents. The crosslinking agents are generally multifunctional vinylic monomers having at least three reactive carbon-carbon double bonds. Multifunctional acrylates that may be used as crosslinking agents include triacrylates, tetraacrylates, tri(meth)acrylates, and tetra(meth)acrylates. Examples are pentaerythritol tetraacrylate (PET), pentaerythritol tetra(meth)acrylate, di(trimethylolpropane) tetraacrylate, and di(trimethylolpropane) tetramethacrylate.

Mixtures of the above monomers are typically used to make copolymers and multipolymers, but any of the monomers may be used as the sole polymerizable monomer in the print material. Some two-part polymerization mixtures may also be used, for example if the polymer is a UV curable epoxy, silicone, or other copolymer. "Curable," in the context of this disclosure, refers to a material that can be processed to grow the molecular weight of at least some components of the material. In some cases, to target certain fluid characteristics, oligomers or prepolymers of the above monomers may be blended with the monomers.

One or more polymerization initiators may be used to cure the mixture. The polymerization initiators are generally thermal or photoinitiators. A thermal initiator is a polymerization initiator whose highest catalytic activity is achieved under thermal stimulus. A photoinitiator is a polymerization initiator whose highest catalytic activity is achieved under radiation, usually ultraviolet radiation. Thus, while a thermal initiator may also have photocatalytic activity, the thermal initiator is most active at elevated temperature. Similarly, while a photoinitiator may be activated merely by elevated temperature, the photoinitiator will reach its highest catalytic activity under some wavelength of radiant energy, usually ultraviolet radiation.

Photoinitiators that may be used include acylphosphine oxides, α-hydroxyketones, phenylglyoxylates, and α-aminoketones. Useful photoinitiators typically absorb radiation having wavelength from about 200 nm to about 400 nm. Acylphosphine oxide examples include 2,4,6-trimethylbenzoyl-diphenylphosphine oxide (TPO) and 2,4,6-trimethylbenzoyl-diphenyl phosphinate, which may be obtained as the Irgacure® TPO initiators from BASF, for example Irgacure® 819. Photoinitiators may be selected based on absorption characteristics of the photoinitiator and of quantum dots and light-scattering particles. Blends of photoinitiators may also be used.

Thermal initiators that may be used include azo nitrile initiators such as 2,2'-azobis(2-methylpropionitrile) (AIBN), 1,1'-azobis(cyclohexanecarbonitrile), 2,2'-azobis(2-methylbutyronitrile), 2,2'-azobis(2,4-dimethylpentanenitrile), 2,2'-azobis(2,4-dimethyl-4-methoxypentanenitrile), and 4,4'- azobis(4-methylcyanopentanoic acid); and peroxide initiators such as tert-amyl peroxybenzoate, tert-butyl peracetate, tert-butyl peroxybenzoate, 2,4-pentanedione peroxide, and 2,2-bis(tert-butlyperoxy)butane. Irgacure® 907 (1-907), which is 2-methyl-4'-(methylthio)-2-morpholino-propiophenone, and Irgacure® 369 (1-369), which is 2-benzyl-2-(dimethylamino)-4'-morpholinobutyrophenone, are both α-aminoketones. Irgacure® 184, which is 1-hydroxycyclohexyl-phenyl-ketone, is an α-hydroxyketone example. Irgacure® 754, which is oxy-phenyl-acetic acid 2-[2 oxo-2 phenyl-acetoxy-ethoxy]-ethyl ester, is a phenylglyoxylate example.

The light-scattering particles are nanoparticles of a ceramic material such as $TiO_2$, $ZrO_2$, $Al_2O_3$, or $SiO_2$, which may be treated or coated with a ceramic material like the above metal-oxides to form a corresponding shell. Examples include TRONOX® CR-828 rutile titanium dioxide pigment, which has $TiO_2$ nanoparticles treated with zirconia alumina via a chloride process. The nanoparticles range in size from 30 nm to 400 nm, such as between about 100 nm to about 250 nm, for example about 130 nm. Coating thickness may be up to 100 nm, for example 1-30 nm, and may include $ZrO_2$, $Al_2O_3$ and/or $SiO_2$. One category of light-scattering particles has composition ranging from 80 wt % to 99 wt % $TiO_2$, 1 wt % to 10 wt % $Al_2O_3$, 0 wt % to 10 wt % $ZrO_2$, and/or 0 wt % to 10 wt % $SiO_2$, thus including compositions that are silica-free. The light-scattering particles may be treated with an organic reagent to adjust the surface pH of the particles by adding hydroxyl ions or other surface composition. The particles have electrical resistance of 8-12 kΩ and oil absorption of 12-20 phw.

Dispersion of quantum dots and/or light-scattering particles is maintained using a dispersant, which can be a dispersing agent and/or plasticizer, having a chemical affinity that is matched to the surface composition of the light-scattering particles, and optionally to surface composition of the quantum dots. The dispersant is either a non-surface active, or a surface active, substance or synergist, which may be a polymer, and which may be a blend of multiple agents. The dispersant is a molecule that interacts with the surface of the light-scattering particles to passivate the light-scattering particles. The surface passivation may occur according to a steric hindrance mechanism or an electrostatic mechanism. The dispersant or dispersants prevent aggregation, agglomeration, or clumping of nanoparticles by, for example, electrostatic stabilization, which improves dispersion stability by interfering with Coulomb attraction between the particle surfaces.

The dispersant may be a polymer with pendant structures having hydroxyl groups, amine groups, or both. The dispersant may be a polymer having alcohol, carboxylic acid, or amine functional groups, or a combination thereof. The dispersant may be a polymer having acidic pendant groups. The dispersant may also have a multifunctional backbone. Examples of dispersants that can be used include polymers having one or two anchor groups or copolymers (for example comb polymers) having multiple anchor groups, such as phosphate, phosphonate, phosphoric acid, phosphorus acid, phosphonic acid, sulfate, sulfinic acid, amine, nitrate, pyridyl, carboxylate, silyl, or carboxylic acid groups. The shelling material used provides a surface composition of the light-scattering particle, which may be an acidic or basic composition, which can be defined by pH. The anchor group of the dispersant is matched to the surface composition to provide a chemical affinity or interactivity that maintains particle dispersion in the mixture. The chemical affinity can be an acid/base ionic affinity, an affinity based on steric hindrance, an affinity based on solubility, or an affinity based on electrostatic forces. For example, dispersion can be enhanced when the particle surface and the dispersant anchor group having different ionic characters. To wit, a basic particle with pH above 7 will have chemical affinity with anionic anchor groups of a dispersant.

Polymeric dispersants can be polymer, copolymer, and/or oligomer chains with pendant groups. Polymers, copolymers, or oligomers that may be used as, or to make, dispersants include polyether, polyester, polyol, polyolefin (including polyacrylate, poly alpha olefin, polystyrene, polyvinyl resin, diolefin polymers, and copolymers and multi-polymers thereof), polyphosphonate, polycarbonate, and silicone. Suitable dispersants may have acidic anchor groups, such as carboxylic acid groups or phosphate groups. Suitable dispersants include Solsperse® 41000, Solsperse 71000 and Solsperse 32000, all available from Lubrizol Corp. Solsperse 41000 is a polyether with acidic anchor groups. Solsperse 71000 is a comb copolymer polyol with multiple acidic anchor groups.

The dispersants are generally formulated at levels at or below about 3 wt % for stable print material formulations. Print materials having only light-scattering particles can be stabilized using these dispersants, or print materials having light-scattering particles and quantum dots may be stabilized using these dispersants. Stable formulations generally include up to 40 wt % solids (quantum dots plus light-scattering particles). A stable formulation may have a concentration of quantum dots that is between 0 wt % and about 35 wt %, such as between about 10 wt % and about 30 wt %, for example about 25 wt %. Stable formulations can have a concentration of light-scattering particles that is between about 0.1 wt % and about 10 wt %, such as between about 2 wt % and about 9 wt %, for example about 5 wt %. Stable formulations can also have a concentration of dispersant that is between about 1 wt % and about 10 wt %, such as between about 2 wt % and about 9 wt %, for example about 5 wt %.

Some useful formulations have a mass ratio of quantum dots to light-scattering particles between about 2 and about 15, such as about 7 to about 10. This ratio is indicative of the total mass of quantum dots added and blended into the final formulation and the total mass of light-scattering particles added and blended into the final formulation. For these formulations, an intermediate mixture obtained while assembling the final formulation may have a mass ratio of quantum dots to light-scattering particles that is outside the above range.

Examples of stable formulations are given below in Table 2. In these examples, four basic mixtures are used as the polymerization matrix for the print mixture, as shown in Table 1. The examples in Table 2 all use Solsperse 41000 and/or Solsperse 71000 as dispersant. The light-scattering particles ("LS") are all $TiO_2$, with the indicated surface coating, and all have been subjected to surface treatment. As noted above, surface coatings are generally up to about 100 nm thick.

TABLE 1

Print Material Matrix Mixtures

|  | A | B | C | D | E | F | G | H |
|---|---|---|---|---|---|---|---|---|
| Initiator Type | TPO | I-907 | I-369 | AIBN | I-907 | I-907 | I-907 | I-907 |
| Monomer 1 Type | BMA | BMA | BMA | BMA | DEGDMA | DEGDMA | DEGDMA | PEG200DMA |
| Monomer 2 Type |  |  |  |  | BMA | DEGEEA |  |  |
| Cross-Link Type | PET | PET | PET | PET | PET | PET | PET | PET |
| Initiator (wt %) | 3 | 10 | 5 | 0.5 | 10 | 10 | 5 | 5 |
| Monomer 1 (wt %) | 30 | 83.55 | 83.55 | 92.33 | 71.2 | 67.5 | 89 | 89 |
| Monomer 2 (wt %) |  |  |  |  | 16.8 | 20.5 |  |  |
| Cross-Link (wt %) | 7 | 6.45 | 6.45 | 7.17 | 2 | 2 | 6 | 6 |

TABLE 2

Stable Print Material Formulations

| LS Particle Size μm | Surface Area m²/g | Coating | pH | Matrix (Table 1) | LS wt % | QD wt % | Dispersant mg/m² SA |
|---|---|---|---|---|---|---|---|
| 0.36 | 11 | Al$_2$O$_3$/SiO$_2$ | 8.2 | A | 5 | 0 | 5 |
| 0.36 | 11 | Al$_2$O$_3$/SiO$_2$ | 8.2 | B | 5 | 0 | 5 |
| 0.36 | 11 | Al$_2$O$_3$/SiO$_2$ | 8.2 | C | 0.1-9 | 0 | 5 |
| 0.19 | 17 | Al$_2$O$_3$/SiO$_2$ | 7.7 | C | 5 | 0 | 2 |
| 0.19 | 17 | Al$_2$O$_3$/SiO$_2$ | 7.7 | C | 5 | 0 | 5 |
| 0.19 | 17 | Al$_2$O$_3$/SiO$_2$ | 7.7 | C | 5 | 0 | 7 |
| 0.19 | 16 | Al$_2$O$_3$/ZrO$_2$ | 7.5 | C | 0.1-9 | 0 | 2 |
| 0.19 | 16 | Al$_2$O$_3$/ZrO$_2$ | 7.5 | C | 0.1-9 | 0 | 5 |
| 0.19 | 16 | Al$_2$O$_3$/ZrO$_2$ | 7.5 | C | 0.1-9 | 0 | 7 |
| 0.19 | 16 | Al$_2$O$_3$/ZrO$_2$ | 7.5 | D | 5 | 0 | 7 |
| 0.36 | 11 | Al$_2$O$_3$/SiO$_2$ | 8.2 | A | 5 | 10 | 5 |
| 0.36 | 11 | Al$_2$O$_3$/SiO$_2$ | 8.2 | B | 2 | 20 | 5 |
| 0.36 | 11 | Al$_2$O$_3$/SiO$_2$ | 8.2 | B | 2 | 25 | 5 |
| 0.36 | 11 | Al$_2$O$_3$/SiO$_2$ | 8.2 | B | 2 | 30 | 5 |
| 0.36 | 11 | Al$_2$O$_3$/SiO$_2$ | 8.2 | B | 3.5 | 20 | 5 |
| 0.36 | 11 | Al$_2$O$_3$/SiO$_2$ | 8.2 | B | 3.5 | 25 | 5 |
| 0.36 | 11 | Al$_2$O$_3$/SiO$_2$ | 8.2 | B | 3.5 | 30 | 5 |
| 0.36 | 11 | Al$_2$O$_3$/SiO$_2$ | 8.2 | B | 5 | 20 | 5 |
| 0.36 | 11 | Al$_2$O$_3$/SiO$_2$ | 8.2 | B | 5 | 25 | 5 |
| 0.36 | 11 | Al$_2$O$_3$/SiO$_2$ | 8.2 | B | 5 | 30 | 5 |
| 0.36 | 11 | Al$_2$O$_3$/SiO$_2$ | 8.2 | B | 6.5 | 20 | 5 |
| 0.36 | 11 | Al$_2$O$_3$/SiO$_2$ | 8.2 | B | 6.5 | 25 | 5 |
| 0.36 | 11 | Al$_2$O$_3$/SiO$_2$ | 8.2 | B | 6.5 | 30 | 5 |
| 0.36 | 11 | Al$_2$O$_3$/SiO$_2$ | 8.2 | B | 8 | 20 | 5 |
| 0.36 | 11 | Al$_2$O$_3$/SiO$_2$ | 8.2 | B | 8 | 25 | 5 |
| 0.36 | 11 | Al$_2$O$_3$/SiO$_2$ | 8.2 | B | 8 | 30 | 5 |
| 0.36 | 11 | Al$_2$O$_3$/SiO$_2$ | 8.2 | C | 5 | 10 | 5 |
| 0.36 | 11 | Al$_2$O$_3$/SiO$_2$ | 8.2 | C | 5 | 20 | 5 |
| 0.36 | 11 | Al$_2$O$_3$/SiO$_2$ | 8.2 | C | 5 | 30 | 5 |
| 0.36 | 11 | Al$_2$O$_3$/SiO$_2$ | 8.2 | C | 9 | 10 | 5 |
| 0.36 | 11 | Al$_2$O$_3$/SiO$_2$ | 8.2 | C | 9 | 20 | 5 |
| 0.36 | 11 | Al$_2$O$_3$/SiO$_2$ | 8.2 | C | 9 | 30 | 5 |
| 0.19 | 16 | Al$_2$O$_3$/SiO$_2$ | 7.5 | C | 5 | 10 | 7 |
| 0.19 | 16 | Al$_2$O$_3$/SiO$_2$ | 7.5 | C | 5 | 20 | 7 |
| 0.19 | 16 | Al$_2$O$_3$/SiO$_2$ | 7.5 | C | 5 | 30 | 7 |
| 0.19 | 16 | Al$_2$O$_3$/SiO$_2$ | 7.5 | D | 5 | 10 | 7 |
| 0.19 | 16 | Al$_2$O$_3$/SiO$_2$ | 7.5 | D | 5 | 20 | 7 |
| 0.19 | 16 | Al$_2$O$_3$/SiO$_2$ | 7.5 | D | 5 | 30 | 7 |
| 0.19 | 19.6 | Al$_2$O$_3$/ZrO$_2$ | 7.4 | E | 5 | 25 | 3 |
| 0.19 | 19.6 | Al$_2$O$_3$/ZrO$_2$ | 7.4 | E | 5 | 25 | 10 |
| 0.19 | 19.6 | Al$_2$O$_3$/ZrO$_2$ | 7.4 | F | 5 | 25 | 3 |
| 0.19 | 19.6 | Al$_2$O$_3$/ZrO$_2$ | 7.4 | F | 5 | 25 | 7 |
| 0.19 | 19.6 | Al$_2$O$_3$/ZrO$_2$ | 7.4 | G | 5 | 0 | 14 |
| 0.19 | 19.6 | Al$_2$O$_3$/ZrO$_2$ | 7.4 | H | 5 | 0 | 14 |

Comparative formulations are shown in Table 3. The comparative formulations were unstable, resulting in flocculation of the solids and separation of the formulations.

TABLE 3

Unstable Formulations

| LS Particle Size μm | Surface Area m²/g | Coating | pH | Matrix (Table 1) | LS wt % | QD wt % | Dispersant mg/m² SA |
|---|---|---|---|---|---|---|---|
| 0.22 | 8.3 | Al$_2$O$_3$/SiO$_2$ | 6.5 | C | 5 | 0 | 2 |
| 0.22 | 8.3 | Al$_2$O$_3$/SiO$_2$ | 6.5 | C | 5 | 0 | 5 |
| 0.22 | 8.3 | Al$_2$O$_3$/SiO$_2$ | 6.5 | C | 5 | 0 | 7 |
| 0.22 | 8.7 | Al$_2$O$_3$/SiO$_2$ | 6.5 | C | 5 | 0 | 2 |
| 0.22 | 8.7 | Al$_2$O$_3$/SiO$_2$ | 6.5 | C | 5 | 0 | 5 |
| 0.22 | 8.7 | Al$_2$O$_3$/SiO$_2$ | 6.5 | C | 5 | 0 | 7 |
| 0.22 | 8.3 | Al$_2$O$_3$/SiO$_2$ | 6.5 | C | 5 | 10 | 5 |
| 0.22 | 8.3 | Al$_2$O$_3$/SiO$_2$ | 6.5 | C | 5 | 20 | 5 |
| 0.22 | 8.7 | Al$_2$O$_3$/SiO$_2$ | 6.5 | C | 5 | 10 | 5 |
| 0.22 | 8.7 | Al$_2$O$_3$/SiO$_2$ | 6.5 | C | 5 | 20 | 5 |

Finished formulations described herein have dynamic viscosity of about 4-40 cP at room temperature. These formulations can be brought to a printable viscosity of about 4-20 cP, for example about 11 cP, by heating or by adding solvents. Viscosity of the final formulation can be adjusted using suitable vinylic monomers or solvents, or by adjusting the proportions of other components in the formulation. For example, amount of high viscosity or viscosity promoting components, such as cross-linking agents, can be decreased to reduce viscosity, and solids loading, or high viscosity or viscosity-promoting components, can be increased to increase viscosity.

Figure 2:
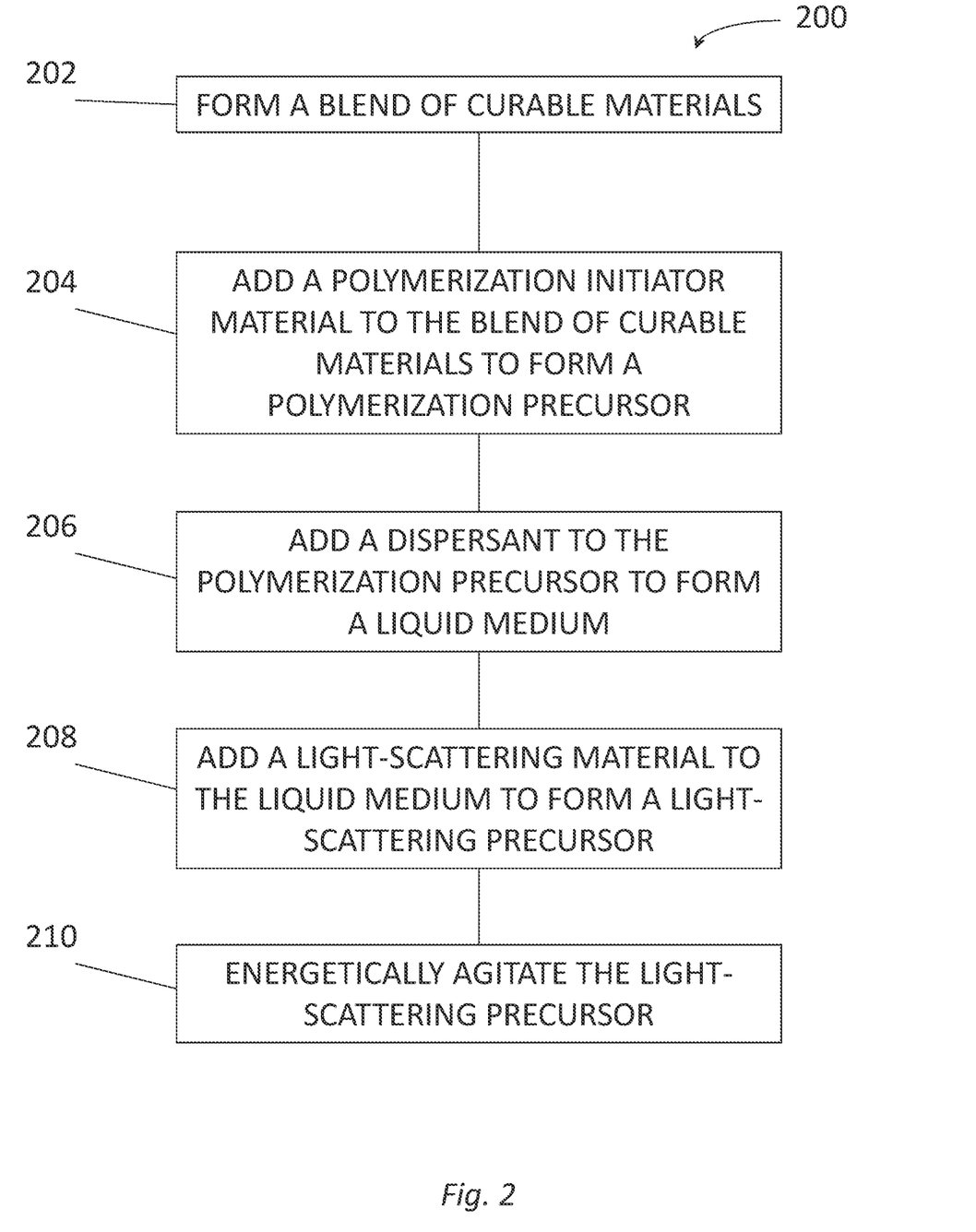
FIG. 2 is a flow diagram summarizing a method according to another embodiment.

A mixing process is followed to make the stable formulations given above. FIG. 2 is a flow diagram summarizing a method 200 according to one embodiment. In general, light-scattering particles are added to a mixture that contains the dispersant. The mixture may contain all the dispersant to be formulated in the print material, or may contain only a portion. If the print material contains no quantum dots, light-scattering particles are added to a mixture of curable material matrix and dispersant and/or synergist. If the print material contains quantum dots, light-scattering particles are added to a mixture of curable material matrix, dispersant and/or synergist, and quantum dots. The light-scattering particles can be added as powder or as a colloidal dispersion, which may contain a quantity of the dispersant and/or synergist. If powder is used, energetic agitation can be applied to the powder before mixing to reduce initial particle agglomeration. Energetic agitation techniques that can be used in this regard include sonication, ball milling, and micro-fluidization. Size-selective centrifugation and/or filtration can also be employed to reduce larger agglomerates.

The mixing process begins at by formulating a matrix material. At 202, a blend of curable monomers is formed. The blend of curable monomers may contain any of the monomers described herein above. The monomers may include any of the crosslinking agents described above. The blend of curable monomers may also contain one or more compatible solvents. Solvents may be used to manage density viscosity, or mix profile to allow the final formulation to be uniformly dispersed and stable.

At 204, a polymerization initiator material is added to the blend of curable monomers to make a polymerization precursor. More than one polymerization initiator may be included in the polymerization initiator material. A solvent can optionally be included as well. The polymerization precursor is typically a low density, low viscosity material that accepts a dispersion of solids. When subjected to a polymerization process, the polymerization precursor forms a matrix that suspends the light-scattering particles, and optionally quantum dots, in a uniform distribution throughout the matrix.

At 206, at least a portion of the dispersant to be used in the formulation is also added to the polymerization precursor. The portion of the dispersant may be as low as 0.3% of the total to be used for the formulation. Adding dispersant to the precursor before any light-scattering particles are added ensures the light-scattering particles disperse effectively upon being added. The curable monomers, optional solvents, polymerization initiators, and dispersants form a liquid medium into which light-scattering materials and optionally quantum dots are dispersed.

At 208, a light-scattering material is added to the liquid medium. The light-scattering material may be a powder of light-scattering particles or a suspension of light-scattering particles in a solvent, which may be, or may include, a quantity of the dispersant up to about 95% of the total dispersant to be used for the complete formulation. The light-scattering particles are mixed into the liquid medium to form a light-scattering precursor.

At 210, the light-scattering precursor is energetically agitated, for example by sonication and/or shaking. Energetic agitation maximizes the interaction of dispersant molecules and particles to establish a dispersive environment around the particles. The dispersant molecules may adhere to the surface of the particles, be drawn into forming an exclusion region around each particle by electrostatic or Van der Waals attraction, or may reduce particle mobility through the liquid medium enough to prevent significant interaction among particles.

The light-scattering precursor can be used as a print material. For example, as noted above to make a blue pixel, a material free of quantum dot frequency conversion particles is applied over the light-emitting component. The light-scattering precursor made above can be used in this way. Additionally, or alternately, the light-scattering precursor can be used as a precursor to make a quantum dot print material.

Figure 3:
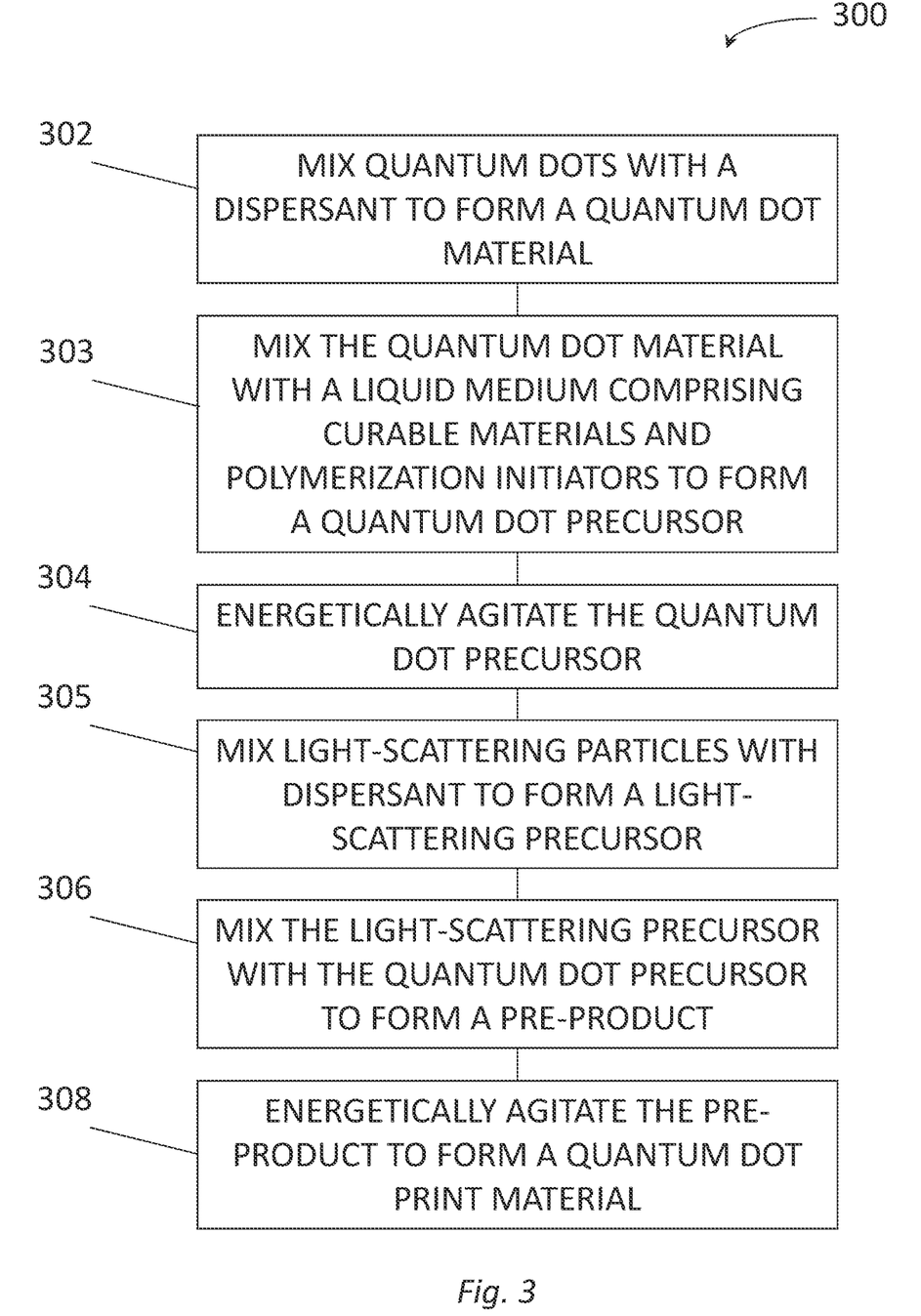
FIG. 3 is a flow diagram summarizing a method according to another embodiment.

FIG. 3 is a flow diagram summarizing a method 300 according to another embodiment. At 302, quantum dots are pre-treated with a dispersant to form a quantum dot material. The dispersant may be a synergist, and may be any of the materials described elsewhere herein. The dispersant may be selected to have a chemical affinity for a surface composition of the quantum dots. Any of the mixing methods described here may be used to maximize dispersion of the quantum dots in the quantum dot material. At least a portion of the total amount of dispersant to be used for the complete formation, at least about 5% and up to 100%, for example 50%, is used to make the quantum dot material.

To make a quantum dot print material, at 303 a quantum dot precursor is made by mixing the quantum dot material into a volume of the liquid medium referred to in the method 200. The quantum dot material of 302 can include all, or only a portion, of the quantum dots for the complete formulation. The quantum dot material can also contain just a portion of the quantum dots to be used for the formulation. In such cases, quantum dots can be added directly to make the quantum dot precursor, such that in any event the quantum dot precursor contains all the quantum dots to be used for the complete formulation. The materials that make up the liquid medium, the curable materials, initiators, and optional solvents, can be added together in any order.

At 304, the quantum dot precursor is subjected to energetic agitation to disperse the quantum dots in the liquid medium. Energetic agitation also maximizes uniform dispersion or solution of the dispersant in the liquid medium prior to introduction of light-scattering particles.

At 305, light-scattering particles are mixed with dispersant to form a light-scattering precursor. The dispersant used here can be the same dispersant as at 302 or a different dispersant, and the light-scattering particles are as described herein. If the dispersants are selected to have chemical affinity matched to surface composition of the particles, either quantum dots or light-scattering particles, the dispersant used for each particle can be different. The dispersant used for the light-scattering particles can be any of the dispersants described herein, and as mentioned above, may be selected to have chemical affinity matched to the surface composition of the light-scattering particles.

At 306, the light-scattering precursor is then mixed into the quantum dot precursor to form a pre-product. Additional dispersant, or synergist, can be added at each mixing operation 303 and 305, if desired. That is to say that the dispersants used for the quantum dots and the light-scattering particles can be added in two volumes, a first volume for pre-mixing with the particles and a second volume for mixing into the respective precursors. Alternately, synergists can be mixed into the quantum dot precursor and/or into the light-scattering precursor. Any synergists used will be matched to the dispersants in each case.

At 308, the pre-product is subjected to energetic agitation to blend the suspensions such that concentration of quantum dots and light-scattering particles is substantially uniform throughout the complete formulation. The agitated mixture forms the quantum dot print material. The quantum dot print material has a mass ratio of quantum dots from about 0.5 to about 45, such as from about 2 to about 15, for example from about 7 to about 10. The energetic agitation of the pre-product ensures the quantum dot print material has local concentrations of quantum dots and light-scattering particles sufficiently close to the average ratio of the overall composition that the composition has the desired optical properties for light conversion, intensity, and divergence throughout.

The complete formulation is a colloid of quantum dot and light-scattering particles, or just light-scattering particles, in a polymerizable monomer matrix. The formulation contains particles, quantum dots and/or ceramic light-scattering particles, dispersed in a curable mixture of matrix materials, crosslinking agents, initiators, and dispersants, potentially of various kinds. Print materials as described herein can be stored under standard ambient conditions and will remain stable for at least a few weeks up to a few months, or can be readily re-dispersed by agitation within such period.

The print materials described above are deposited on a substrate and then cured to make the color materials of the pixels 108 of FIG. 1. The print materials are deposited in a pattern of pixels with red quantum dots, pixels with green quantum dots, and pixels with no quantum dots to make red, green, and blue pixels, respectively, on the substrate. The print material is placed in position on the substrate in a series of deposits made, for example, using an inkjet printer or other liquid placement device. Following deposition of the liquid print material, the substrate may be dried to remove any solvent needed. The substrate may then be subjected to ultraviolet radiation to activate any photoinitiators in the print material. The radiation is directed to the print material on the substrate, where polymerization begins. Concurrently, or subsequently, the substrate may be heated to activate any thermal initiators in the print material. Polymerization hardens the print material into a color material made of the polymer, light-scattering particles, optionally quantum dots, initiator residues, and dispersant residues or adducts.

While the foregoing is directed to embodiments of the present invention, other and further embodiments of the present disclosure may be devised without departing from the basic scope thereof, and the scope thereof is determined by the claims that follow.

What is claimed is:

1. A print material, comprising:
   a vinylic molecule;
   a vinylic cross-linker molecule having a plurality of vinyl groups;
   a light-scattering particle having a surface composition;
   a quantum dot having a surface composition; and
   a polymer dispersant having a functional group from the group consisting of a phosphate group, a phosphonate group, a phosphorus acid group, a sulfate group, a sulfinic acid group, a nitrate group, a carboxylate group, a silyl group, an acidic pendant group, or a combination thereof, wherein the polymer dispersant has a chemical affinity matched to the surface composition of the light-scattering particle and matched to the surface composition of the quantum dot.

2. The print material of claim 1, further comprising a polymerization initiator.

3. The print material of claim 2, wherein the polymer is a polyether, a polyester, a polyol, a polyacrylate, a poly alpha olefin, a polystyrene, a polyvinyl resin, a diolefin polymer, a polyphosphonate, a polycarbonate, a silicone, or a combination thereof.

4. The print material of claim 3, wherein the dispersant has a multifunctional polymer backbone.

5. The print material of claim 1, wherein the light scattering particle is a titanium dioxide particle.

6. The print material of claim 5, wherein the vinylic molecule is an acrylate.

7. The print material of claim 1, further comprising a plurality of light-scattering particles having the surface composition, a plurality of quantum dots, and a mass ratio of quantum dots to light-scattering particles from about 0.5 to about 45.

8. The print material of claim 1, wherein the print material has a dynamic viscosity of about 4-40 cP at room temperature.

9. A method of making a material layer, comprising:
   applying a mixture to a substrate, the mixture comprising:
   a vinylic molecule;
   a vinylic cross-linking agent having a plurality of vinyl groups;
   a light-scattering particle having a surface composition;
   a quantum dot having a surface composition; and
   a polymer dispersant having a chemical affinity matched to the surface composition of the light-scattering particle and to the surface composition of the quantum dot, the polymer dispersant selected from the group consisting of a polyol, a poly alpha olefin, a polystyrene, a polyvinyl resin, a diolefin polymer, a polyphosphonate, a polycarbonate, and combinations thereof; and
   polymerizing the mixture to form a material layer on the substrate.

10. The method of claim 9, wherein the mixture further comprises a polymerization initiator.

11. The method of claim 9, wherein the polymer dispersant has an acidic anchor group.

12. The method of claim 9, wherein the polymer dispersant has pendant structures with carboxylic acid groups, hydroxyl groups, amine groups, or a combination thereof.

13. The method of claim 9, wherein the polymer dispersant has alcohol groups, carboxylic acid groups, amine groups, or a combination thereof.

14. The method of claim 9, wherein the polymer dispersant has a multifunctional polymer backbone.

15. The method of claim 9, wherein the vinylic molecule is an acrylate.

16. The method of claim 9, wherein the mixture is made by a process comprising:
   forming a liquid medium comprising the vinylic molecule, the vinylic cross-linking agent, and the polymerization initiator;
   adding a quantum dot composition comprising the quantum dot to the liquid medium;
   energetically agitating the liquid medium with the quantum dot;
   adding at least a portion of the polymer dispersant to the liquid medium and quantum dots to form a quantum dot precursor;
   adding a light-scattering composition comprising the light-scattering particle to the quantum dot precursor to form a pre-product; and
   energetically agitating the pre-product to form the mixture.

17. A method of making a print material, comprising:
   blending a quantum dot material with a curable material to form a quantum dot mixture;
   blending a polymer dispersant with the quantum dot mixture to form a quantum dot precursor, wherein the polymer dispersant comprises a polymer selected from the group consisting of a polyether, a polyester, a polyol, a polyacrylate, a poly alpha olefin, a polystyrene, a polyvinyl resin, a diolefin polymer, a polyphosphonate, a polycarbonate, a silicone, and a combination thereof; and
   blending a light-scattering particle material with the quantum dot precursor to make a print material.

18. The method of claim 17, wherein blending the dispersant with the quantum dot mixture comprises energetically agitating the quantum dot mixture with the dispersant, and blending the light-scattering particle material with the quantum dot precursor comprises energetically agitating the light-scattering particle material with the quantum dot precursor, and wherein the dispersant has a chemical affinity that is matched to a surface composition of light-scattering particles in the light-scattering particle material.

19. The method of claim 17, wherein the polymer dispersant has an acidic anchor group.

20. The method of claim 17, wherein the polymer dispersant has a functional group selected from the group consisting of a hydroxyl group, an amine group, an alcohol group, a carboxylic acid group, an acidic pendant group, a phosphate group, a phosphonate group, a phosphoric acid group, a phosphorus acid group, a phosphonic acid group, a sulfate group, a sulfinic acid group, a nitrate group, a pyridyl group, a carboxylate group, a silyl group, or a combination thereof.

* * * * *